United States Patent
Takeuchi

(10) Patent No.: US 8,073,035 B2
(45) Date of Patent: *Dec. 6, 2011

(54) SURFACE EMITTING LASER, MANUFACTURING METHOD OF SURFACE EMITTING LASER, SURFACE EMITTING LASER ARRAY, MANUFACTURING METHOD OF SURFACE EMITTING LASER ARRAY, AND OPTICAL APPARATUS INCLUDING SURFACE EMITTING LASER ARRAY

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

This patent is subject to a terminal disclaimer.

(21) Appl. No.: 12/509,676

(22) Filed: Jul. 27, 2009

(65) Prior Publication Data
US 2010/0027576 A1 Feb. 4, 2010

(30) Foreign Application Priority Data
Jul. 31, 2008 (JP) ................................. 2008-198984

(51) Int. Cl.
*H01S 5/00* (2006.01)
(52) U.S. Cl. .................. 372/50.124; 372/43.01; 438/29; 257/E21.53
(58) Field of Classification Search .................... 438/22, 438/24, 27, 29; 372/45.01, 50.11, 50.23, 372/50.1, 50.124, 44.01, 43.01, 96, 99; 257/E21.53
See application file for complete search history.

(56) References Cited

U.S. PATENT DOCUMENTS

| | | | |
|---|---|---|---|
| 5,052,016 A * | 9/1991 | Mahbobzadeh et al. | ......... 372/96 |
| 7,596,163 B2 * | 9/2009 | Yoshikawa et al. | ...... 372/50.124 |
| 7,609,745 B2 | 10/2009 | Takeuchi | ......................... 372/99 |
| 2002/0176474 A1 * | 11/2002 | Huang et al. | ..................... 372/96 |
| 2005/0286597 A1 * | 12/2005 | Mukoyama et al. | ........ 372/50.23 |
| 2007/0221908 A1 * | 9/2007 | Takahashi et al. | ............... 257/13 |
| 2009/0080489 A1 | 3/2009 | Uchida et al. | ............. 372/50.124 |
| 2009/0135872 A1 | 5/2009 | Uchida et al. | ............... 372/44.01 |
| 2009/0135876 A1 | 5/2009 | Takeuchi et al. | ........... 372/50.11 |
| 2009/0213889 A1 | 8/2009 | Takeuchi | ................... 372/45.01 |
| 2010/0027578 A1 * | 2/2010 | Takeuchi | ................. 372/50.124 |

FOREIGN PATENT DOCUMENTS

| JP | 2001-284722 A | 10/2001 |
|---|---|---|
| JP | 2007-158153 A | 6/2007 |

OTHER PUBLICATIONS

H.J. Unold et al., "Singlemode output power enhancement of InGaAs VCSELs by reduced spatial hole burning via surface etching," Electronics Letters, vol. 37, No. 9, Apr. 26, 2001.

J.A. Vukusic et al., "Numerical Optimization of the Single Fundamental Mode Output from a Surface Modified Vertical-Cavity Surface-Emitting Laser," IEEE Journal of Quantum Electronics, vol. 37, No. 1, Jan. 2001, pp. 108-117.

* cited by examiner

*Primary Examiner* — Khiem D Nguyen
(74) *Attorney, Agent, or Firm* — Fitzpatrick, Cella, Harper & Scinto

(57) ABSTRACT

A surface emitting laser configured by laminating on a substrate a lower reflection mirror, an active layer and an upper reflection mirror includes, in a light emitting section of the upper reflection mirror, a structure for controlling reflectance that is configured by a low reflectance region and a convex high reflectance region formed in the central portion of the low reflectance region, and which oscillates at a wavelength of λ, wherein the upper reflection mirror is configured by a multilayer film reflection mirror based on a laminated structure formed by laminating a plurality of layers, and an absorption layer causing band-to-band absorption is provided in the laminated structure.

11 Claims, 12 Drawing Sheets

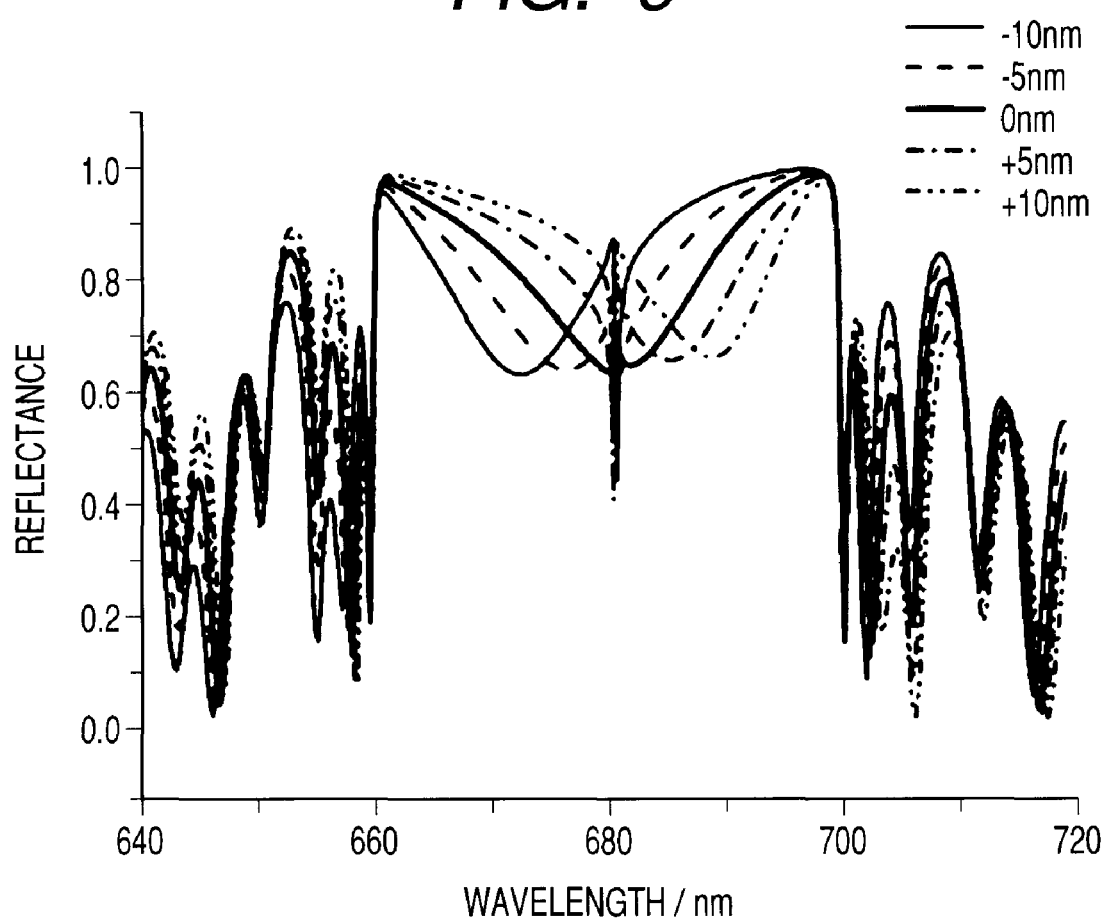

SURFACE EMITTING LASER, MANUFACTURING METHOD OF SURFACE EMITTING LASER, SURFACE EMITTING LASER ARRAY, MANUFACTURING METHOD OF SURFACE EMITTING LASER ARRAY, AND OPTICAL APPARATUS INCLUDING SURFACE EMITTING LASER ARRAY

BACKGROUND OF THE INVENTION

1. Field of the Invention

The present invention relates to a surface emitting laser, a manufacturing method of the surface emitting laser, a surface emitting laser array, a manufacturing method of the surface emitting laser array, and an optical apparatus including the surface emitting laser array.

2. Description of the Related Art

As one of the surface emitting lasers, there is known a vertical cavity surface emitting laser (hereinafter referred to as VCSEL).

According to the surface emitting laser of this type, a light beam can be taken out perpendicularly to a semiconductor substrate surface, and hence a two-dimensional array can be easily formed only by changing a mask pattern at the time of forming the laser elements.

The parallel processing using the plurality of beams emitted from the two-dimensional array enables the increase in density and speed, and hence is expected to be applied in various industrial fields.

For example, when the surface emitting laser array is used as an exposure light source of an electrophotographic printer, it is possible to increase the density and speed in the printing process by using the plurality of beams.

In such electrophotographic printing process, it is necessary to form stable and minute laser spots on a photosensitive drum. Thus, a stable operation in a single transverse mode or a single longitudinal mode is also required as a laser characteristic.

In recent years, there has been developed a method in which a current constriction structure is formed so as to allow current to be injected only into a necessary region.

In this method, in order to enhance the performance of the surface emitting laser, current is allowed to be injected only into a necessary region by forming the current constriction structure in such a manner that a layer having a high Al composition, for example, an AlGaAs layer having an Al composition of 98% is formed in a multilayer film reflection mirror and selectively oxidized in a high temperature steam atmosphere.

Meanwhile, the above described method using selective oxidization is not desirable from the viewpoint of realizing a single transverse mode oscillation.

That is, a refractive index difference which is larger than needed is caused due to the existence of the oxidized layer, so that high order transverse modes are generated.

As a method to cope with this problem, there is used a method, and the like, in which a single transverse mode oscillation is achieved in such a manner that the diameter of the light emitting region is reduced to about 3 µm by using the above described current constriction structure so as to prevent the high order transverse modes from being confined.

However, in the method of restricting the light emitting region, the light emitting region is reduced, and thereby the output per element is significantly reduced.

For this reason, heretofore, there have been investigated methods for realizing a single transverse mode oscillation while maintaining a light emitting region which is larger to some extent than the region obtained in the case where the single transverse mode oscillation is realized only by reducing the light emitting region by using the above described current constriction structure.

That is, there have been investigated methods in which a single transverse mode oscillation can be realized by intentionally introducing a loss difference between a fundamental transverse mode and a high order transverse mode, while maintaining a light emitting region that is large to some extent.

As one of the methods, a so-called surface relief method is disclosed in Japanese Patent Application Laid-Open No. 2001-284722, H. J. Unold et al., Electronics Letters, Vol. 37, No. 9 (2001) 570, and J. A. Vukusic et al., IEEE JOURNAL OF QUANTUM ELECTRONICS, Vol. 37, No. 1, 2001 (108).

The surface relief method is a method in which the loss in the high order transverse mode is increased to be larger than the loss in the fundamental transverse mode by applying level difference processing to the element surface which is the light emitting surface of the surface emitting laser element.

Note that in the present specification, it is assumed that, in the following, the level difference structure, which is provided, as described above, in the light emitting region of the light emitting surface of the reflection mirror to control the reflectance of the reflection mirror, is referred to as a surface relief structure.

Generally, as a mirror for the VCSEL, there is used a multilayer film reflection mirror in which a plurality of pairs of layers, each of which has a different refractive index and an optical thickness of one fourth of a laser oscillation wavelength (that hereinafter may be referred to as ¼ wavelength unless otherwise specified), are laminated so that the two layers are alternately arranged.

Usually, the multilayer film reflection mirror is terminated by a high refractive index layer, so that a high reflectance of 99% or more is obtained by also using the reflection on the final interface with air having a low refractive index.

Here, there will be first described a convex surface relief structure illustrated in FIG. 2A. Such convex surface relief structure is also disclosed in H. J. Unold et al., Electronics Letters, Vol. 37, No. 9 (2001) 570. When as in a low reflection region 204 illustrated in FIG. 2A, the final layer of a high refractive index layer 206 (having an optical thickness of ¼ wavelength) is removed, the multilayer film reflection mirror is terminated by a low refractive index layer 208. Thereby, a convex surface relief structure is obtained.

According to such convex surface relief structure, the phase of a light beam reflected by the interface between the low refractive index layer 208 and the air having a refractive index lower than that of the low refractive index layer 208 is made to shift by π from the phase of a light beam which is totally reflected by the multilayer film reflection mirror that exists under the interface.

For this reason, in the low reflection region 204, the reflectance is reduced to, for example, 99% or less, so that the reflection loss can be increased to about 5 to 10 times.

The above principle is used in order to introduce a loss difference between the fundamental transverse mode and the high order transverse mode. That is, the low reflection region 204 is formed only in the peripheral portion of the light emitting section so as to increase the overlap between the low reflection region 204 and a high order transverse mode light distribution 212.

On the other hand, a high reflection region 202 is left in the central portion of the light emitting section so as to increase the overlap between a fundamental transverse mode light distribution 210 and the high reflection region 202 in which the final layer of the high refractive index layer 206 is left.

Thereby, the reflection loss in the high order transverse mode is increased, so that the high order transverse mode oscillation is suppressed and only the fundamental transverse mode oscillation is obtained.

Further, as in the low reflection region 204 illustrated in FIG. 2B, it is also possible to configure a concave surface relief structure in such a manner that a low refractive index layer is (or a high refractive index layer may also be) further added on the final layer of the high refractive index layer 206 by an optical thickness of ¼ wavelength.

Such concave surface relief structure is also disclosed in Japanese Patent Application Laid-Open No. 2001-284722. Even with such configuration, the phase is shifted by π in the low reflection region 204, and hence the reflectance can be reduced based on the same principle as the convex surface relief structure, so that the fundamental transverse mode oscillation can be realized.

According to the above described surface relief structure in the prior art form disclosed in Japanese Patent Application Laid-Open No. 2001-284722, H. J. Unold et al., Electronics Letters, Vol. 37, No. 9 (2001) 570, and J. A. Vukusic et al., IEEE JOURNAL OF QUANTUM ELECTRONICS, Vol. 37, No. 1, 2001 (108), a single transverse mode oscillation can be realized while the light emitting region is maintained to be larger to some extent than the light emitting region obtained in the case where the single transverse mode is realized only by the current constriction structure.

However, the reflectance in the surface relief structure is sensitively influenced by the thickness of layers forming the surface relief structure, and has a great influence on realizing the single transverse mode oscillation. Therefore, it is extremely important to control the layer thickness in the manufacture of the surface relief structure.

That is, the surface relief structure has a feature that the reflectance (reflection loss) is very sensitive to the layer thickness removed or added in the manufacture of the surface relief structure.

Next, there will be further described features of the above described surface relief structure.

FIG. 3 is a figure which is described in J. A. Vukusic et al., IEEE JOURNAL OF QUANTUM ELECTRONICS, Vol. 37, No. 1, 2001 (108) and in which the layer thickness removed by the surface relief is plotted along the horizontal axis while the induced loss is plotted along the vertical axis (left side).

From FIG. 3, there can be seen a state where the loss has peaks appearing periodically with respect to the layer thickness which is removed.

Further, the peak is steep, and when a desired loss value is to be introduced, the layer thickness which is removed needs to be controlled with very high accuracy (+/−5 nm or less).

On the other hand, the amount of the loss greatly influences the extent to which the single mode oscillation is realized, and further greatly influences the output characteristic of the element.

Therefore, in the manufacture of the surface relief structure, it is necessary to highly precisely control the layer thickness in order to manufacture elements which have good reproducibility and uniformity and which are capable of performing a single mode operation with the same characteristics.

In other words, it can be said that in the case where the surface relief structure is manufactured, when the thickness of the layer to be removed or added can be simply grasped with high accuracy and when the layer thickness can be adjusted according to the grasped layer thickness, the reproducibility and uniformity in the manufacture of the element can be greatly improved.

An object of the present invention is to provide a surface emitting laser including a convex surface relief structure, the layer thickness of which can be highly precisely controlled and which is capable of performing a single mode operation with good reproducibility and uniformity, and to provide a manufacturing method of the surface emitting laser.

SUMMARY OF THE INVENTION

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a convex high reflectance region formed in the central portion of the low reflectance region, and which oscillates at a wavelength of $\lambda$, wherein the upper reflection mirror is configured by a multi-layer film reflection mirror based on a laminated structure formed by laminating a plurality of layers, and an absorption layer causing band-to-band absorption is provided in the laminated structure.

The absorption coefficient of the absorption layer can be 5000 cm$^{-1}$ or more for the wavelength $\lambda$.

The absorption layer can be provided on the surface side from a layer laminated at the middle point in thickness of the laminated structure, and is provided in a layer other than the outermost surface layer.

The absorption layer can be provided within five pairs of layers from the surface side of the laminated structure.

The absorption layer can be arranged so that when seen from the surface side of the multilayer film reflection mirror, a part of the absorption layer is included in the interface from a high refractive index layer to a low refractive index layer in the multilayer film reflection mirror.

The convex shape in the light emitting section of the upper reflection mirror can be formed by selective etching.

The present invention is directed to an optical apparatus comprising, as a light source, a surface emitting laser array configured by arranging a plurality of the surface emitting lasers.

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a convex high reflectance region formed in the central portion of the low reflectance region, and which oscillates at a wavelength of $\lambda$, wherein the upper reflection mirror is configured by a multi-layer film reflection mirror based on a laminated structure formed by laminating a plurality of layers, and an absorption layer having an absorption coefficient of 5000 cm$^{-1}$ or more for the wavelength $\lambda$ is provided in the laminated structure.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in the central portion of the low reflectance region, and which oscillates at a wavelength of $\lambda$, the manufacturing method comprising; forming, when a multilayer film reflection mirror based on a laminated structure formed by laminating a plurality of layers is formed as the upper reflection mirror, an absorption layer causing band-to-band absorption in the laminated structure, measuring reflection spectra by irradiating light to the laminated structure after forming the absorption layer and before the end of forming the multilayer film reflection mirror, measuring a broad dip wavelength obtained by measuring the reflection spectra, and adjusting the thickness of the surface layer of the laminated structure based on the dip wavelength.

The manufacturing method of the surface emitting laser can further comprise forming, when the absorption layer is formed, the absorption layer on the surface side from a layer laminated at the middle point in thickness of the laminated structure, and in a layer other than the outermost surface layer.

The manufacturing method of the surface emitting laser can further comprise forming, when the absorption layer is formed, the absorption layer within five pairs of layers from the surface side of the laminated structure.

The manufacturing method of the surface emitting laser can further comprise forming, when the absorption layer is formed, the absorption layer so that when seen from the surface side of the multilayer film reflection mirror, a part of the absorption layer is included in the interface from a high refractive index layer to a low refractive index layer in the multilayer film reflection mirror.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in the central portion of the low reflectance region, and which oscillates at a wavelength of $\lambda$, the manufacturing method comprising: forming, when a multilayer film reflection mirror based on a laminated structure formed by laminating a plurality of layers is formed as the upper reflection mirror, an absorption layer causing band-to-band absorption in the laminated structure, forming a semiconductor layer on the surface of the laminated structure after forming the absorption layer and before the end of forming the multilayer film reflection mirror, measuring reflection spectra by irradiating light to the semiconductor layer formed on the surface of the laminated structure, measuring a broad dip wavelength obtained by measuring the reflection spectra, and adjusting the thickness of the semiconductor layer based on the dip wavelength.

The absorption layer can be made of a material having an absorption coefficient of 5000 $cm^{-1}$ or more for the wavelength $\lambda$.

The manufacturing method of the surface emitting laser can further comprise forming, when the absorption layer is formed, the absorption layer on the surface side from a layer laminated at the middle point in thickness of the laminated structure, and in a layer other than the outermost surface layer.

The manufacturing method of the surface emitting laser can further comprise forming, when the absorption layer is formed, the absorption layer within five pairs of layers from the surface side of the laminated structure.

The manufacturing method of the surface emitting laser can further comprise forming, when the absorption layer is formed, the absorption layer so that when seen from the surface side of the multilayer film reflection mirror, a part of the absorption layer is included in the interface from a high refractive index layer to a low refractive index layer in the multilayer film reflection mirror.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in the central portion of the low reflectance region, and which oscillates at a wavelength of $\lambda$, the manufacturing method comprising: forming, when a multilayer film reflection mirror based on a laminated structure formed by laminating a plurality of layers is formed as the upper reflection mirror, an absorption layer having an absorption coefficient of 5000 $cm^{-1}$ or more for the wavelength of $\lambda$ in the laminated structure, measuring reflection spectra by irradiating light to the laminated structure after forming the absorption layer and before the end of forming the multilayer film reflection mirror, measuring a broad dip wavelength obtained by measuring the reflection spectra, and adjusting the thickness of the surface layer of the laminated structure based on the dip wavelength.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in the central portion of the low reflectance region, and which oscillates at a wavelength of $\lambda$, the manufacturing method comprising; forming, when a multilayer film reflection mirror based on a laminated structure formed by laminating a plurality of layers is formed as the upper reflection mirror, an absorption layer having an absorption coefficient of 5000 $cm^{-1}$ or more for the wavelength of $\lambda$ in the laminated structure, forming a semiconductor layer on the surface of the laminated structure after forming the absorption layer and before the end of forming the multilayer film reflection mirror, measuring reflection spectra by irradiating light to the semiconductor layer formed on the surface of the laminated structure, measuring a broad dip wavelength obtained by measuring the reflection spectra, and adjusting the thickness of the semiconductor layer based on the dip wavelength.

According to the present invention, it is possible to realize a surface emitting laser including a convex surface relief structure, the layer thickness of which can be highly precisely controlled and which is capable of performing a single mode operation with good reproducibility and uniformity, and it is possible to realize a manufacturing method of the surface emitting laser.

Further, according to the present invention, it is possible to realize a surface emitting laser array configured by the above described surface emitting lasers, a manufacturing method of the surface emitting laser array configured by the surface emitting lasers, which is based on the above described manufacturing method of the surface emitting laser, and an optical apparatus including the surface emitting laser array.

Further features and aspects of the present invention will become apparent from the following description of exemplary embodiments with reference to the attached drawings.

BRIEF DESCRIPTION OF THE DRAWINGS

FIG. 9 is a figure for describing the difference in the dip wavelength due to the difference in the layer thickness of the surface layer in the reflection region of exemplary embodiment 1 according to the present invention, and illustrating the reflection spectra of the wafer layer structure of the surface emitting laser.

DESCRIPTION OF THE EMBODIMENTS

Preferred embodiments of the present invention will now be described in detail in accordance with the accompanying drawings.

According to the above described configuration of the present invention, it is possible to manufacture a highly precise convex surface relief structure. Thereby, it is possible to provide a surface emitting laser which is capable of performing a single mode operation with excellent reproducibility and uniformity, and to provide a manufacturing method of the surface emitting laser.

This is based on the following knowledge obtained as a result of an extensive investigation by the present inventors.

The present inventors measured reflection spectra in the state where a wafer was grown up to the layer corresponding to the low reflection region (204 in FIG. 2A) in the surface emitting laser layer structure.

Figure 5:
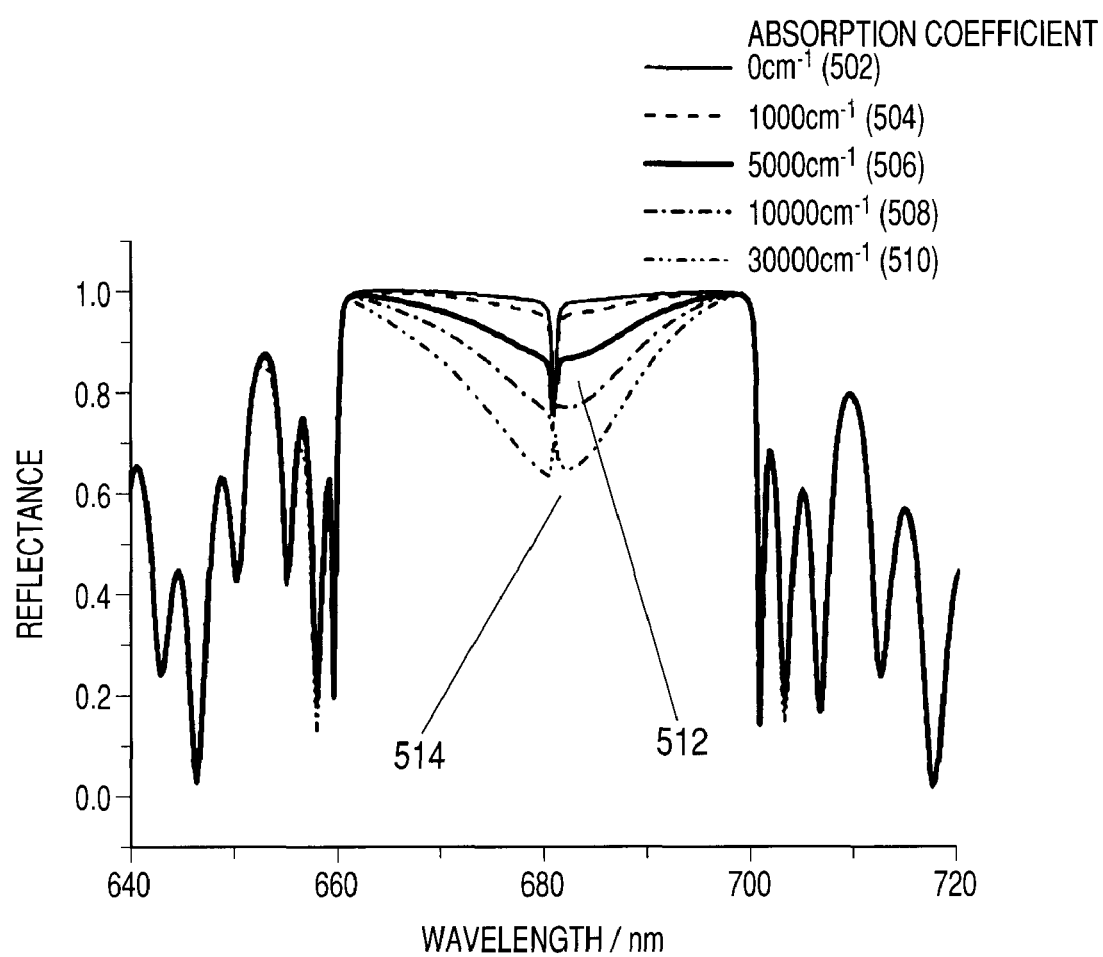
FIG. 5 is a figure for describing the difference in the dip shape due to the difference in the absorption coefficient of the absorption layer in the exemplary embodiment according to the present invention, and illustrating reflection spectra of the wafer layer structure of the surface emitting laser.

As a result, it was found that broad dips 514 are generated as indicated by lines 506, 508, and 510 in FIG. 5.

Then, there was found a method for quantitatively estimating the amount of introduced loss by grasping the wavelength (hereinafter referred to as dip wavelength) corresponding to the dip.

The dip wavelength reflects the thickness information of the layer forming the low reflection region in the relief structure, and the amount of introduced loss can be quantitatively estimated from the dip wavelength. In other words, it can be said that the layer thickness of the surface layer forming the low reflection region may be adjusted so as to make the dip wavelength correspond to a desired amount of loss.

Next, the principle will be described.

FIG. 5 is a figure for describing the difference in the dip shape due to the difference in the absorption coefficient of the absorbing layer. In order that the dip wavelength 514 in the low reflection region in FIG. 5 can be grasped from the reflection spectrum measurement, the wafer layer structure needs to satisfy the following conditions.

As the first condition, there is prepared a wafer (laminated structure) in which the upper multilayer film reflection mirror is not completely formed in the surface emitting laser layer structure, and in which the formation of the layer structure is stopped after the surface of the low reflection region or a portion of the low reflection region near the surface thereof in the relief structure is formed.

Further, as the second condition, in the laminated structure, a layer which causes a large absorption of an band-to-band absorption level (5000 cm$^{-1}$ or more) in the oscillation wavelength is provided on the surface side from the middle point in thickness of the upper multilayer film reflection mirror of the surface emitting laser layer structure.

Figure 4:
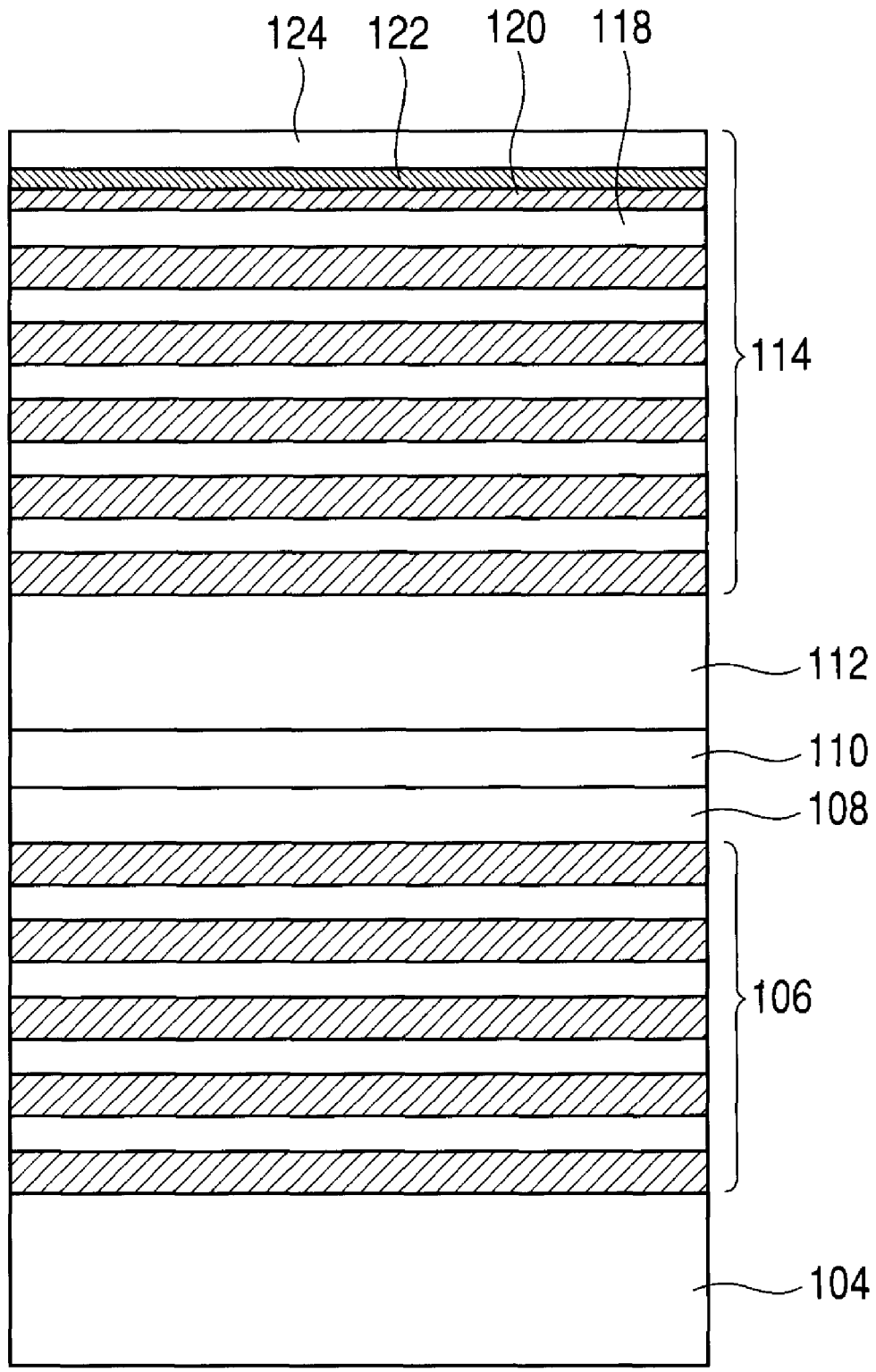
FIG. 4 is a cross-sectional schematic view for describing a wafer layer structure of a surface emitting laser including a convex surface relief structure in an exemplary embodiment according to the present invention.

FIG. 4 illustrates an example in the case of a red surface emitting laser based on a wafer layer structure satisfying the above described conditions. FIG. 5 illustrates examples of reflection spectra of the above described wafer layer structure.

The reflection spectra are measured so as to cover a range from the short wavelength side to the long wavelength side with the laser oscillation wavelength as the center.

FIG. 4 shows the final wafer layer structure for forming the red surface emitting laser.

In order to form the laminated structure as the first condition, a p-type GaAs/Al0.5Ga0.5As layer 124 illustrated in the figure is not grown, and the crystal growth is stopped after a p-type GaAs absorption layer 122 is grown, so that the state where the surface of the low reflection region is exposed is formed.

At this time, an Al0.9Ga0.1As low refractive index layer 120 exists under the GaAs absorption layer 122. For example, the total layer thickness of the Al0.9Ga0.1As low refractive index layer 120 and the GaAs absorption layer 122 is adjusted to become an optical thickness of about ¼ wavelength.

Thereby, the phase of the light reflected from the interface between the GaAs absorption layer and the air is shifted by π from the phase of the light reflected from the interface existing under the interface between the GaAs absorption layer and the air, so that the substantial reflectance is reduced and a low reflection region is formed on the surface of the GaAs absorption layer 122.

Further, as the second condition, the GaAs absorption layer 122 absorbs the light of the oscillation wavelength of 680 nm by band-to-band absorption, and hence two of the above described first and second conditions are satisfied.

In this case, in the reflection spectra, there can be seen a sharp resonance wavelength distribution 512 due to the high reflection band of the multilayer film reflection mirrors 106 and 114, and the surface emitting laser resonator, and further the reflection spectra can also be observed as follows.

That is, a broad dip wavelength distribution 514 in the low reflection region can also be observed as shown by solid line 506 (in the case of absorption coefficient of 5000 $cm^{-1}$) in FIG. 5.

Next, there will be described reasons why the broad dip wavelength distribution 514 is generated in the above described low reflection region.

Here, in the laminated structure as specified by the first condition, that is, in the low reflection region, the multilayer film reflection mirror 114 is terminated by the GaAs layer (122)/Al0.9Ga0.1As low refractive index layer (120), the total thickness of which is set to the optical thickness of ¼ wavelength.

Therefore, in view of the structure which is formed by combining these layers and an Al0.5Ga0.5As high refractive index layer 118 having an optical thickness of ¼ wavelength and existing immediately below these layers, and which has an optical thickness of ½ wavelength, a reflection mirror formed by the interface between the air and the GaAs layer exists in the upper portion of the structure, while a reflection mirror of the upper multilayer film reflection mirror 114 of the surface emitting laser exists in the lower portion of the structure.

That is, this means that a resonator is newly formed by the outermost surface of the low reflection region in addition to the surface emitting laser resonator. The resonance wavelength of the new resonator is observed as the resonance wavelength in the low reflection region.

However, in this state as it is, the reflectances of the upper and lower portions are greatly different from each other, and hence it is difficult to clearly observe the resonance wavelength.

Here, when the absorption as the second condition is introduced, the reflectance at the resonance wavelength is greatly reduced, so as to form the broad dip, and thereby the value of the resonance wavelength can be first practically specified.

FIG. 5 shows two kinds of reflection spectra in a case (502) where no absorption exists, and reflection spectra in a case (504) where small absorption (1000 $cm^{-1}$) exists.

In the case where no absorption or small absorption exists, the reduction in the dip can hardly be recognized, and hence the wavelength cannot be clearly specified.

Further, as the absorption of a semiconductor, free carrier absorption, and the like, may occur other than the band-to-band absorption.

However, in the free carrier absorption, even when a very high doping of about $1 \times 10^{20}$ $cm^{-3}$ is used, the absorption coefficient of only about 1000 $cm^{-1}$ can be obtained. As a result, a sufficient dip is not formed, and hence the object of the present invention cannot be sufficiently attained.

On the other hand, the absorption coefficient of the band-to-band absorption is generally in a range of 5000 $cm^{-1}$ or more, and hence sufficient dips are obtained as denoted by reference numerals 506, 508 and 510 in FIG. 5, so as to enable the wavelength to be specified.

Meanwhile, this absorption layer is indispensable to specify the resonance wavelength 514 in the low reflection region, but the absorption layer is not necessary as the surface emitting laser and may cause degradation of laser element characteristics.

Therefore, there are some desirable forms in the structure and arrangement of the absorption layer. First, the absorption layer needs to be arranged on the surface side from the middle point in thickness of the upper multilayer film reflection mirror, on the side opposite to the substrate used for the crystal growth.

It is preferred that the absorption layer is formed within five pairs of layers on the surface side of the upper multilayer film reflection mirror. Specifically, it is configured such that the absorption layer is provided on the surface side from a layer laminated in the middle of the laminated structure which configures the upper multilayer film reflection mirror, and is provided in a layer other than the outermost surface, and that the absorption layer is provided within five pairs of layers from the surface side of the laminated structure. This is because when the surface emitting laser functions to oscillate in the single fundamental transverse mode, the light distribution in the in-plane direction is concentrated on the high reflection region, and the main light distribution in the depth direction is reduced toward the surface as denoted by reference numeral 606 in FIG. 6.

Figure 6:
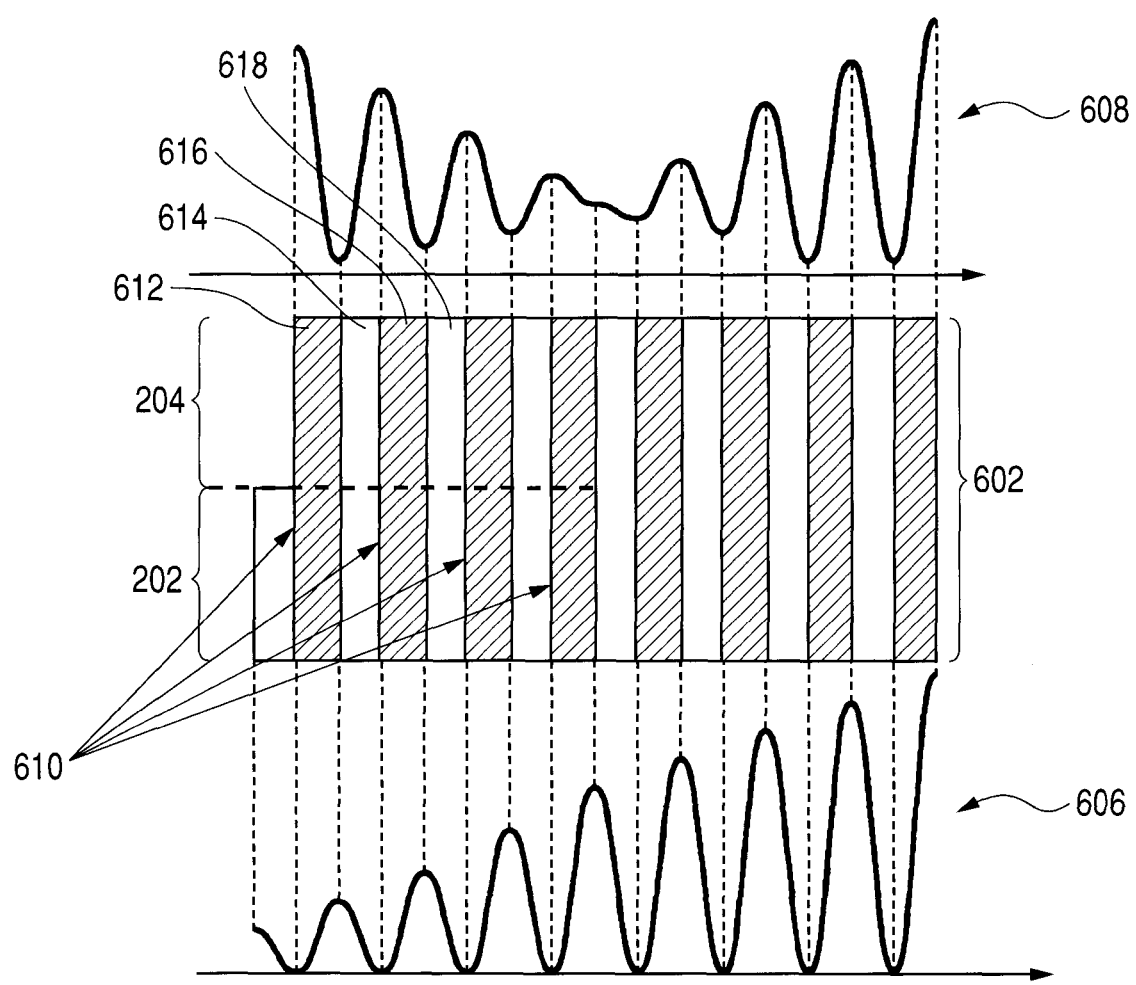
FIG. 6 is a figure for describing the layer structure of the multilayer film reflection mirror of the surface emitting laser in the exemplary embodiment according to the present invention, and internal light intensity distributions at the time when the element is driven and when the reflection spectra are measured.

On the other hand, when the reflection spectra of the low reflection region are measured, the light distribution is increased toward the outermost surface as denoted by reference numeral 608 in FIG. 6.

However, even in the low reflection region, the light distribution is gradually increased, as shown in FIG. 6, on the side near an active layer (substrate) in the multilayer film reflection mirror.

For this reason, when the absorption layer is arranged on the side near the surface in the multilayer film reflection mirror, the necessary absorption is increased at the time of reflection spectrum measurement so as to enable the resonance wavelength 514 to be clearly specified, while unnecessary absorption is reduced at the time of operation of the surface emitting laser, so as to suppress the degradation of the element characteristics.

Further, as shown in FIG. 6, it is preferred that in the upper multilayer film reflection mirror, the absorption layer is arranged near a interface 610 from the high refractive index layer to the low refractive index layer, when seen from the surface.

In this case, as shown in FIG. 6, on the surface side of the multilayer film reflection mirror, an antinode is formed near the interface in the low reflection region as shown by the light distribution 608, so that the absorption is increased. Thereby, the dip wavelength 514 can be measured more clearly in the reflection spectrum measurement.

On the other hand, a node of the light distribution 606 is formed near the interface in the high reflection region, so that the absorption can be suppressed as much as possible and the influence of the absorption layer on the element characteristics can be minimized.

Figure 13:
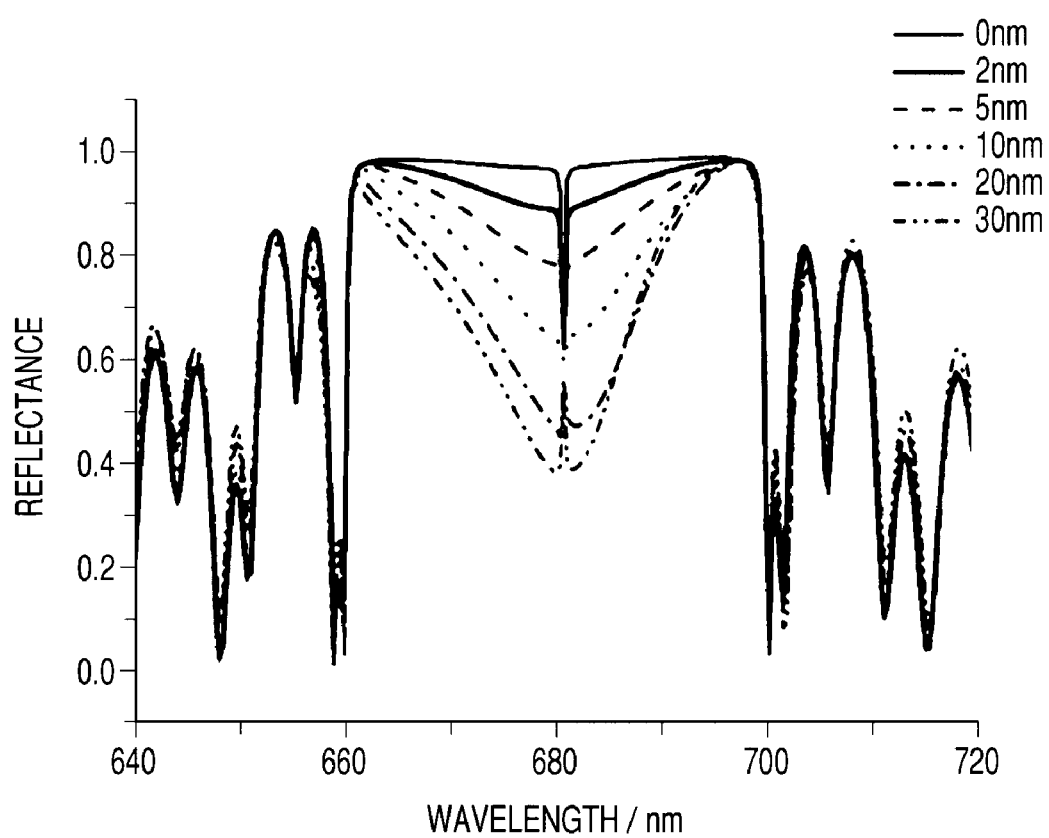
FIG. 13 is a figure for describing the difference in the dip shape due to the difference in the thickness of the absorption layer in the exemplary embodiment according to the present invention, and illustrating reflection spectra of the wafer layer structure of the surface emitting laser.

Further, it can be seen from FIG. 13 that the thickness of the absorption layer needs to be set to at least 2 nm or more in order to enable the dip wavelength to be clearly observed.

On the other hand, when the thickness of the absorption layer is excessively increased, unnecessary absorption is increased during operation of the element. Thus, it is preferred that the thickness of the absorption layer is set to be less than the half (about 30 nm) of the layer configuring the multilayer film reflection mirror.

Subsequently, in order to clarify the relationship between the dip wavelength and the introduced reflection loss, the variations were assumed in the thickness of the layers forming the upper multilayer film reflection mirror, and the dip wavelength and the loss were investigated in the case where such variations were caused.

Specifically, the dip wavelength and the loss were investigated by assuming not only the case where the layer thickness of the first layer (low refractive index layer 612) of the low reflection region 204 as shown in FIG. 6 is varied, but also the case where the layer thickness of the layers under first layer is varied.

That is, the case where the layer thickness of each of the second layer (high refractive index layer 614), the third layer (low refractive index layer 616), and the fourth layer (high refractive index layer 618) is separately varied in the range of −20 to +20 nm from a target value (usually set to the optical thickness of ¼ wavelength), was assumed as the case which may be caused in the crystal growth, and the like.

Then, there was investigated how the dip wavelength and the reflection loss are changed in this case.

When each of the layers shown in FIG. 6 is made to specifically correspond to the layers shown in FIG. 4, the first layer corresponds to a layer which is obtained by combining the GaAs absorption layer 122 and the Al0.9Ga0.1As low refractive index layer 120 and which has the optical thickness of ¼ wavelength.

Further, the second layer corresponds to the Al0.5Ga0.5As high refractive index layer 118 (the optical thickness of ¼ wavelength).

Further, the third layer corresponds to the layer having the optical thickness of ¼ wavelength (Al0.9Ga0.1As low refractive index layer) existing under the Al0.5Ga0.5As high refractive index layer 118.

Further, the fourth layer corresponds to the layer having the optical thickness of ¼ wavelength (Al0.5Ga0.5As high refractive index layer) existing under the third Al0.9Ga0.1As low refractive index layer.

Figure 7:
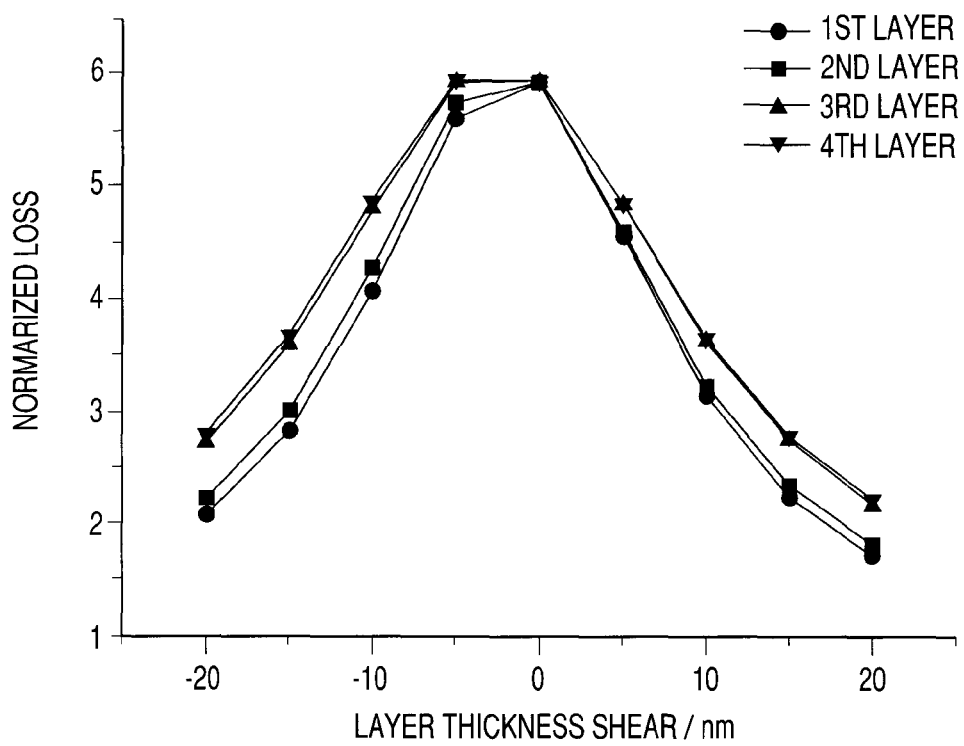
FIG. 7 is a figure for describing the layer thickness dependency of the normalized loss introduced into the low reflection region in the exemplary embodiment according to the present invention, and illustrating the normalized loss introduced when the layer thickness of each of the first layer to the fourth layer is varied.

FIG. 7 shows the change of the loss introduced when the thickness of each of the layers is varied.

Here, there was used, as a loss, a value (normalized loss) normalized by the loss value in the state where the layer structure is formed up to the high reflection region 202, that is, the final layer.

From this figure, it was seen that not only when the thickness of the first layer is varied but also when the thickness of the second, third, or fourth layer that exists under the first layer is varied, the loss introduced according to the variation amount is almost similarly changed.

In other words, this means that highly precise control of only the thickness of the first layer is not sufficient to control the introduced loss.

From this investigation, it was found that it is necessary to control the thickness of the whole layers including the layers which exist under the first layer and which form the multilayer film reflection mirror.

Subsequently, there was also investigated a relationship between the shift in the dip wavelength in the low reflection region and the introduced loss in the case where the thickness of each of the four layers is separately varied as described above.

Here, the shift in the dip wavelength means a shift from the reference wavelength set to the dip resonance wavelength in the case where all of the first to fourth layers have the same optical thickness of ¼ wavelength.

Figure 8:
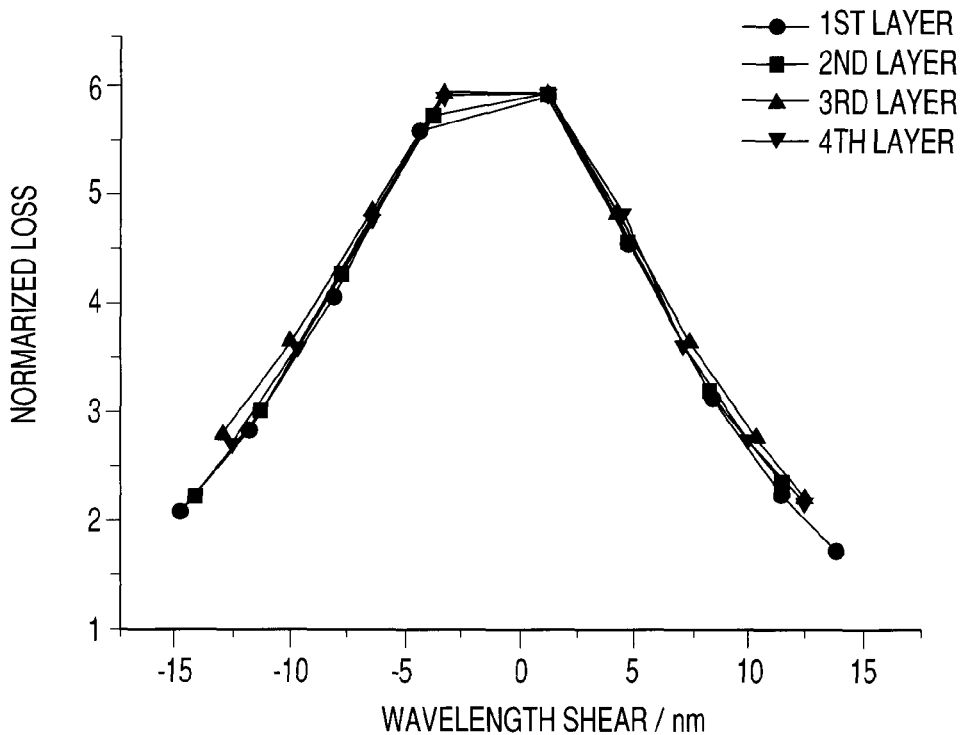
FIG. 8 is a figure for describing the dip wavelength dependency of the normalized loss introduced into the low reflection region in the exemplary embodiment according to the present invention, and illustrating the normalized loss introduced when the layer thickness of each of the first layer to the fourth layer is varied.

FIG. 8 shows the relationship. The horizontal axis represents the shift in the dip wavelength and the vertical axis represents the normalized loss similarly to FIG. 7. As a result, it can be seen that even when not only the thickness of the first layer but also the thickness of the layers under the first layer are varied, the loss is reduced almost similarly according to the variation of each of the layers. That is, it can be seen that even when the thickness of the second, third, or fourth layer under the first layer is varied, the dip wavelength is shifted by the amount corresponding to the variation amount, and the loss is reduced almost similarly according to the amount of the shift in the dip wavelength.

In other words, it was found that as long as only the shift in the dip wavelength is grasped, the introduced loss can be quantitatively estimated without the need to precisely grasp the amount of the variation of each of the layers.

Further, it can be seen from the figure that a necessary loss can be obtained by adjusting, for example, only the thickness of the first layer so as to make the dip wavelength become a value corresponding to the loss to obtain the desired loss.

Here, description is given by taking as an example the red surface emitting laser, and hence the GaAs layer is taken as an example of the absorption layer. However, any layer may be used as long as the layer exhibits a sufficient absorption performance at the oscillation wavelength. For example, AlGaAs, AlGaAsP, InGaAsP, InGaAs, and the like are listed for a red surface emitting laser having a wavelength of 680 nm.

There is listed InGaAs for a surface emitting laser having a wavelength band of 700 to 1000 nm.

Further, for a ZnSe based surface emitting laser having a shorter wavelength, there are listed MgZnCdSSeTe, ZnCdSe, and the like. For a GaN based surface emitting laser, there are listed AlGaInNPAs, InGaN, and the like.

Next, there will be specifically described a manufacturing procedure of a surface relief structure using this principle.

First, a necessary loss value in the low reflection region is determined in order to obtain desired element characteristics.

There are calculated a layer thickness corresponding to the loss and a dip wavelength in the low reflection region in the case of the loss.

For example, when a normalized loss of 6 in FIG. 8 is necessary, the shift from the dip wavelength in the low reflection region in the case where each of the layers of the region is formed to have the layer thickness equivalent to the optical thickness of ¼ wavelength, is set to 0 nm as the target value of the dip wavelength.

On the other hand, when a normalized loss of 4 is necessary, the wavelength shift from the dip wavelength in the low reflection region in the case where each of the layers of the region is formed to have the layer thickness equivalent to the optical thickness of ¼ wavelength, is set to −8 nm or +5 nm as the target value of the dip wavelength.

The reflection spectra are measured at the time when the layers up to the p-type GaAs absorption layer 122 are crystally grown, and it is checked whether or not the shift in the dip wavelength is set to the above described desired value.

When the shift is not sufficient, the GaAs layer is grown again, while when the shift is excessive, the adjustment is performed by etching, and the like.

In this way, the crystal growth is once stopped to measure the reflection spectra, and hence the wafer needs to be once taken out from the crystal growing apparatus into the atmosphere.

Therefore, it is preferred that the outermost surface of the wafer is terminated by a layer not containing Al.

Alternatively, by performing in situ observation of the reflection spectra during the crystal growth, the crystal growth may be ended at the time when a desired dip wavelength is obtained.

In this case, it is not necessary to take out the wafer from the crystal growing apparatus, and hence the outermost surface of the wafer need not necessarily be terminated by a layer not containing Al.

Figure 3:
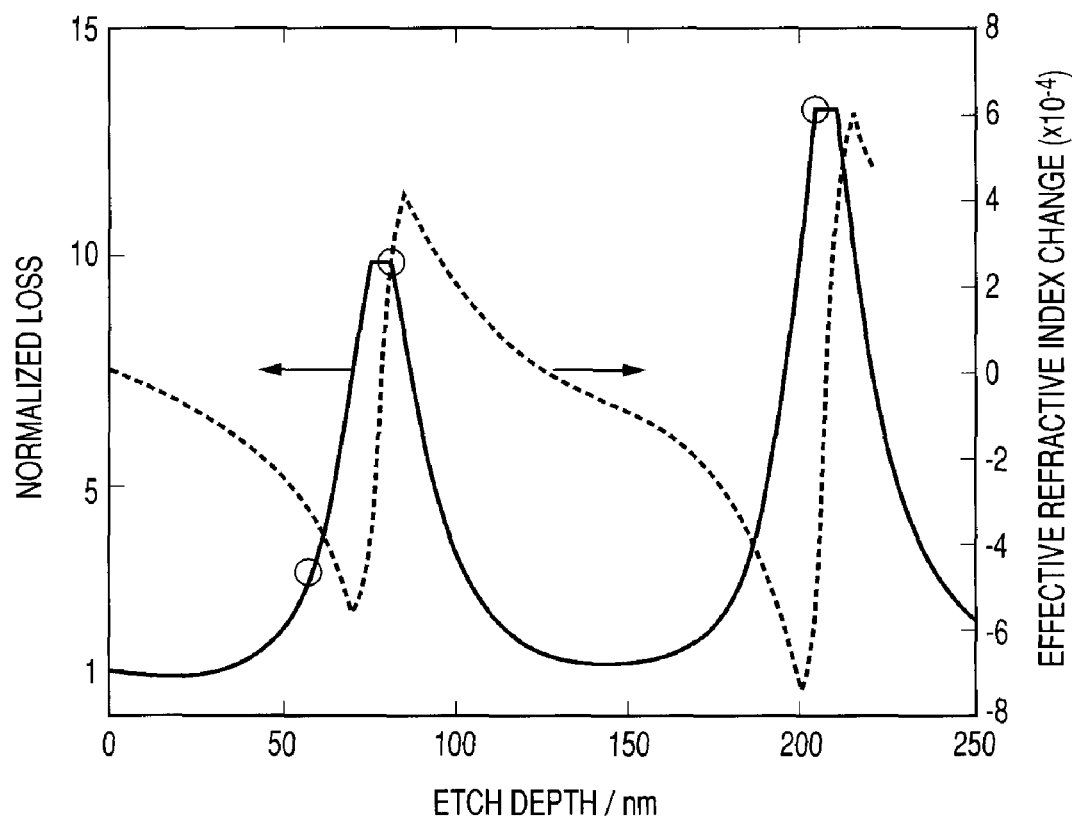
FIG. 3 is a figure illustrating an example of the layer thickness dependency of the normalized loss introduced into the laser structure, in the relief structure which is the prior art form and disclosed in J. A. Vukusic et al., IEEE JOURNAL OF QUANTUM ELECTRONICS, Vol. 37, No. 1, 2001 (108).

Anyway, after a desired dip wavelength is confirmed from the reflection spectra, the p-type GaAs/Al0.5Ga0.5As high refractive index layer 124 is crystally grown, so that the wafer formation is ended. When the wafer formation is ended by this layer, it is possible to form the high reflection region necessary for laser oscillation. As shown in FIG. 3, the allowable range of the layer thickness, in which high reflectance can be obtained, is large (±15 nm), and hence the layer thickness can be sufficiently controlled by controlling the time of crystal growth.

Figure 2A:
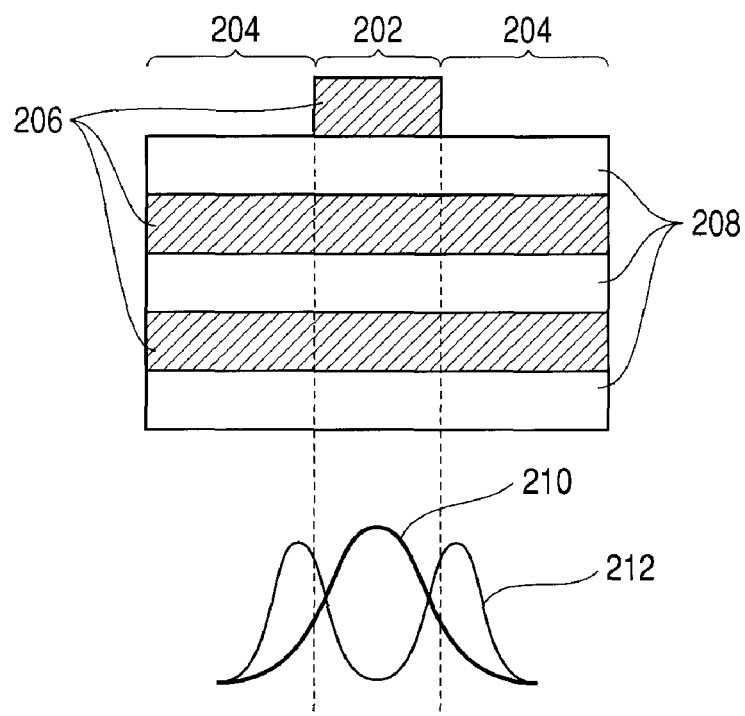
FIGS. 2A and 2B are cross-sectional schematic views for describing a convex surface relief structure (FIG. 2A) and a concave surface relief structure (FIG. 2B) which are used in the prior art form.
Figure 2B:
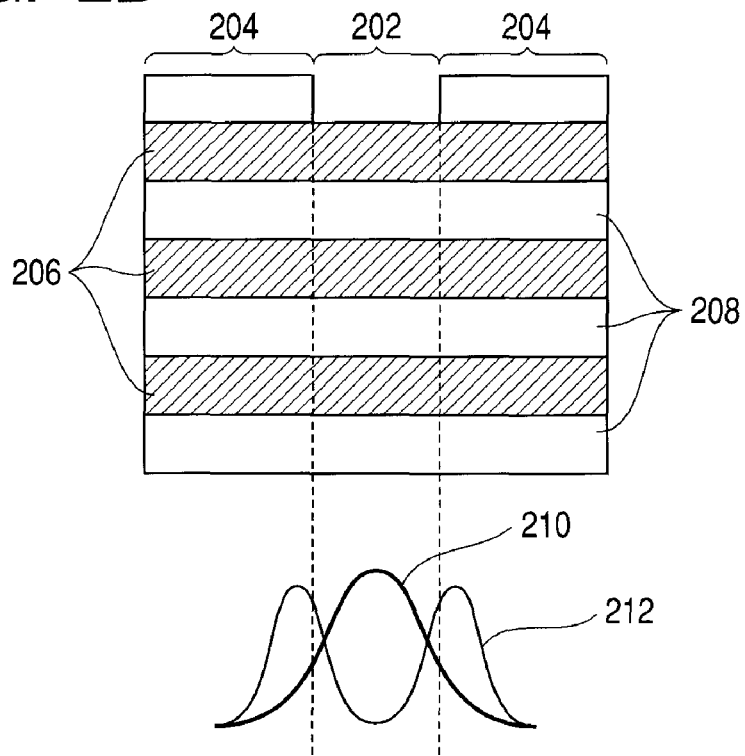

Next, there will be described the manufacture of a surface relief structure in the wafer in which the introduced loss is controlled as described above. A low reflection region is formed by removing the p-type GaAs/Al0.5Ga0.5As high refractive index layer 124 presently existing at the outermost surface, for example, in a ring shape by using dry or wet etching, so that a convex relief as shown in FIG. 2A can be formed.

As shown in FIG. 3, the allowable layer thickness, at which the low reflection region (high loss region) can be obtained, is very narrow (±5 nm), and hence high controllability is required for the above described etching.

Therefore, in this etching, it is preferred to use the selective etching using an etching stop layer. When description is given by using, for example, the structure shown in FIG. 4, it is considered that the GaAs contact layer existing at the outermost surface is first removed by a citric acid based etchant, so as to expose the Al0.5Ga0.5As high refractive index layer, and that the layer is removed up to the GaAs absorption layer by using other etchant. Alternatively, it is also considered that the GaInP layer is used as an etching-stop layer, and the GaAs/AlGaAs layers are selectively etched at once by using a sulfuric acid based etchant.

Alternatively, on the wafer in which the layers up to the low reflection region are formed, a region serving as the low reflection region is masked by a dielectric film, and the like, without using the etching.

Then, a convex relief structure may also be formed by selectively growing the GaAs contact layer/Al0.5Ga0.5As high refractive index layer 124 in the region serving as the high reflection region other than the masked region.

A highly precise convex surface relief structure can be manufactured by performing the above described procedure, and thereby an element having excellent reproducibility and uniformity can be manufactured.

According to the manufacturing method of the above described exemplary embodiment, a convex surface relief structure can be manufactured with good precision, but the material used for the manufacture of the surface relief structure is not limited to the AlGaAs based semiconductor material.

For example, various semiconductor materials, such as other III-V group compound semiconductors or II-VI group compound semiconductors, can be applied.

Further, the structure of the present exemplary embodiment can also be applied to a relief structure using other materials, such as a dielectric material and a metallic material.

Further, in the above, description is given by taking as an example a surface emitting laser, but the principle according to the present invention is not limited to the surface emitting laser. The principle according to the present invention can also be applied to a light emitting and receiving element using a general multilayer film reflection mirror.

Exemplary Embodiments

In the following, there will be described exemplary embodiments according to the present invention.

Exemplary Embodiment 1

As exemplary embodiment 1, there will be described a configuration example of a vertical cavity surface emitting laser including a convex surface relief structure and oscillating at 680 nm, and a manufacturing method of the surface emitting laser.

Figure 1:
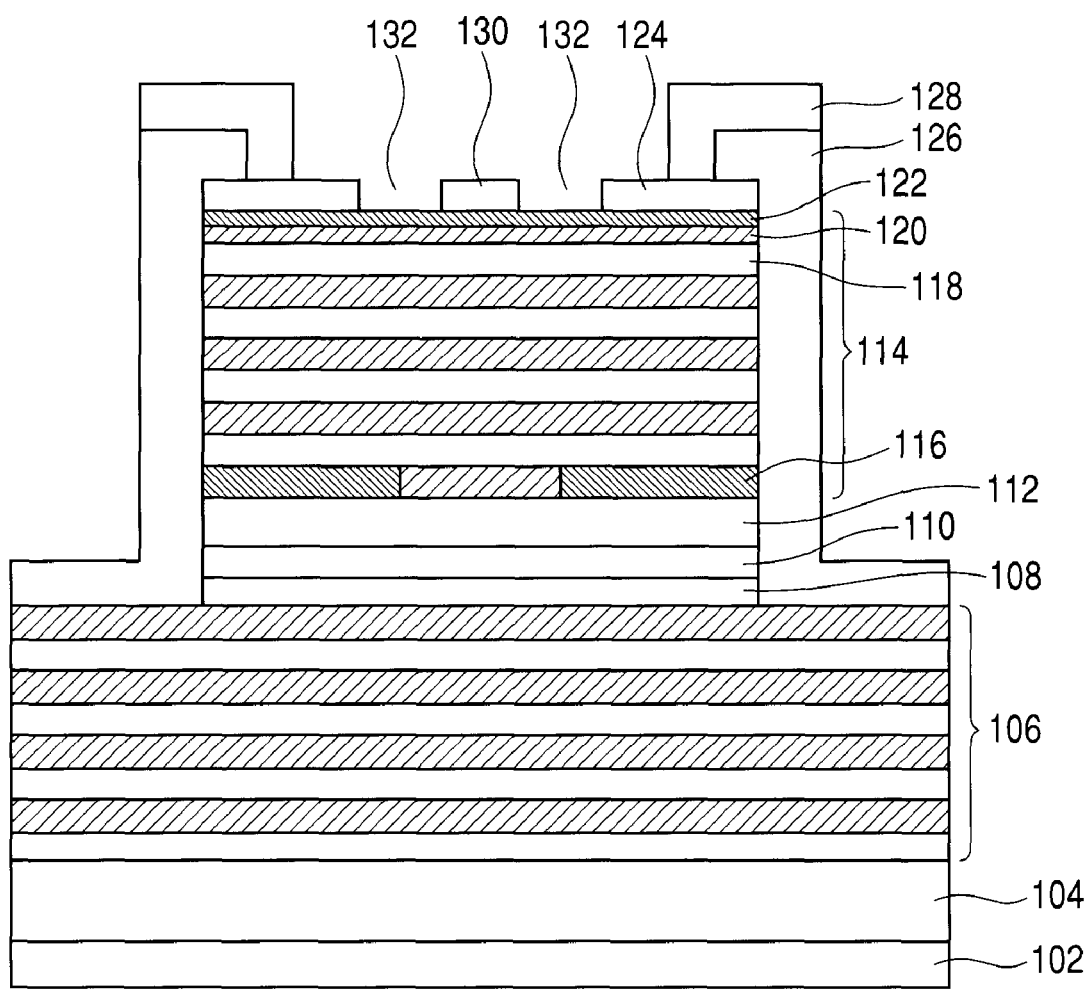
FIG. 1 is a cross-sectional schematic view for describing a vertical cavity surface emitting laser including a convex surface relief structure in exemplary embodiment 1 according to the present invention, and a manufacturing method of the surface emitting laser.

FIG. 1 is a cross-sectional schematic view for describing a configuration example of a vertical cavity surface emitting laser in the present exemplary embodiment.

In FIG. 1, reference numeral 102 denotes an n-side electrode, reference numeral 104 denotes an n-type GaAs substrate, reference numeral 106 denotes an n-type AlAs/Al0.5Ga0.5As multilayer film reflection mirror, reference numeral 108 denotes an n-type AlGaInP spacer layer, and reference numeral 110 denotes a GaInP quantum well active layer.

Reference numeral 112 denotes a p-type AlGaInP spacer layer, reference numeral 114 denotes a p-type Al0.9Ga0.1As/Al0.5Ga0.5As multilayer film reflection mirror, reference numeral 116 denotes an Al0.98Ga0.02As oxidization constriction layer, and reference numeral 118 denotes a p-type Al0.5Ga0.5As high refractive index layer. Reference numeral 120 denotes a p-type Al0.9Ga0.1As low refractive index layer, and reference numeral 122 denotes a p-type GaAs absorption layer. Here, in order to obtain a largest loss in the low reflection region, the total optical thickness of the two layers 120 and 122 is set to ¼ wavelength.

In the case where the loss can be reduced less than the above value, for example, FIG. 7 may be referred to and a layer thickness may be selected so as to correspond to the value in FIG. 7.

Reference numeral 124 denotes a p-type GaAs contact/Al0.5Ga0.5As high refractive index layer, and the contact layer is subjected to high concentration p-type doping of $5 \times 10^{19}$ cm$^3$ or higher. Reference numeral 126 denotes an insulating film, and reference numeral 128 denotes a p side electrode.

In the present exemplary embodiment, the active layer 110 has a multiple quantum well structure which is configured by a plurality of GaInP quantum well layers and a plurality of Al0.25Ga0.25In0.5P barrier layers.

The layer thickness of the n-type AlGaInP spacer layer 108 and the p-type AlGaInP spacer layer 112 is adjusted so that the multiple quantum well structure is located at an antinode of an internal light standing wave. As a resonator configured by these layers and having an oscillation wavelength of 680 nm, the layer thickness of the layers is adjusted to become an integer multiple of the oscillation wavelength.

The active layer itself is adjusted and manufactured so as to have an emission peak wavelength (for example, 660 to 670 nm) which is set on the shorter wavelength side of the resonance wavelength of the surface emitting laser resonator.

The n-type multilayer film reflection mirror 106 is configured by laminating 60 pairs of an n-type AlAs low refractive index layer and an n-type Al0.5Ga0.5As high refractive index layer, each of which layer has an optical thickness of ¼ oscillation wavelength of 680 nm.

The center wavelength of the reflection band of this reflection mirror is adjusted to 680 nm which is the oscillation wavelength. Si and Se are doped in order to obtain n-type conductivity.

In order to further lower the electric resistance, there may also be used a method, such as a method of providing a composition inclined layer between two layers having different refractive indexes, and a method of using a modulation doping in which the doping amount is reduced around an antinode of the light distribution to lower the electric resistance while reducing the optical absorption, and in which the doping amount is increased around a node of the light distribution.

The P-type multilayer film reflection mirror 114 is configured by laminating 34 pairs of the p-type Al0.9Ga0.1As low refractive index layer 120 and the p-type Al0.5Ga0.5As high refractive index layer 118, each of which layer has the optical thickness of ¼ wavelength of 680 nm.

The center wavelength of the reflection band of this reflection mirror is adjusted to 680 nm which is the oscillation wavelength. C and Zn are doped in order to obtain p-type conductivity.

In order to further lower the electric resistance, the method of using the composition inclined layer, which is used for the n-type multilayer film reflection mirror, and the like, can also be applied to the p-type reflection mirror.

One of the p-type Al0.9Ga0.1As low refractive index layers 120 near the active layer in the p-type multilayer film reflection mirror is replaced by the p-type Al0.98Ga0.02As oxidization constriction layer 116.

This layer is selectively oxidized under a high temperature steam atmosphere, so as to be insulated from the peripheral portion of the element, and thereby a current constriction structure which allows current to flow only through the central portion thereof is formed.

In the present exemplary embodiment, the region in which current is allowed to flow by the oxidization constriction was adjusted to an almost circular shape having a diameter of 6 μm.

In order to realize a single fundamental transverse mode oscillation, the light emission central portion is terminated by the p-type GaAs/Al0.5Ga0.5As high refractive index layer 124 so that high reflectance necessary for the oscillation can be obtained. Further, the surface of GaAs absorption layer 122 is exposed by removing the high refractive index layer 124 in the light emission peripheral portion, so that the low reflection region for preventing the high order mode oscillation is formed.

Next, there will be described in detail an example of a manufacturing method of the vertical cavity surface emitting laser in the present exemplary embodiment.

The structure of the vertical cavity surface emitting laser is the same as that as described above, and is manufactured by the following processes.

First, in the first process, the surface layer thickness of the low reflection region is determined.

Next, in the second process, the absorption layer is determined.

Next, in the third process, the dip wavelength in the low reflection region is calculated.

Next, in the fourth process, the reflection spectra in the low reflection region are measured, so as to be compared with the calculation value of the dip wavelength in the third process. The layer thickness of the surface layer is adjusted until the actually measured value of the dip wavelength coincides with the calculation value.

Next, in the fifth process, the remaining layer structure portion is formed.

Next, in the sixth process, elements are formed by using the wafer subjected to the above described adjustment.

In the following, there will be described in more detail each of the above described processes in order.

In the first process, there is determined the layer thickness of the surface layer (specifically the layer obtained by combining the layers 120 and 122) for forming the low reflection region with sufficient loss necessary to realize the single mode oscillation.

In the present exemplary embodiment, as the layer thickness in which the normalized loss of 6 as illustrated in FIG. 8 is obtained, the p-type GaAs absorption layer 122 having a thickness 10 nm, and the p-type Al0.9Ga0.1As low refractive index layer 120 having a thickness of 42 nm were selected so as to make the total thickness of the two layers become the optical thickness of ¼ wavelength.

Here, the optical thickness of ¼ wavelength was selected, but a layer thickness corresponding to a necessary loss may be selected according to a required element characteristics, for example, by referring to FIG. 7.

Further, it may also be devised such that a hetero barrier is reduced by inserting a graded layer in each of the interfaces, so as to suppress an unnecessary increase of electric resistance.

In the second process, an band-to-band absorption layer is arranged in the upper multilayer film reflection mirror so as to allow the dip wavelength to be measured with good accuracy.

More preferably, the layer is arranged in the form as described above. Further, in order to form the low reflection region with good precision, it is preferred to configure the process such that the selective etching for removing the uppermost p-type GaAs/Al0.5Ga0.5As high refractive index layer 124 can be performed.

Thus, the GaAs layer having the thickness 10 nm was selected here as the absorption layer 122, and was also used as the etching stop layer. Based on the above, the final structure is formed as follows.

That is, from the outermost surface, there are formed the p-type GaAs contact layer having the thickness of 20 nm, the Al0.5Ga0.5As high refractive index layer having the thickness of 27 nm (corresponding to the layer 124 in FIG. 4, and corresponding to the optical thickness of ¼ wavelength), and the GaAs absorption layer 122 having the thickness of 10 nm (also serves as the etching stop layer). Further, there are formed the Al0.9Ga0.1As low refractive index layer 120 having the thickness of 42 nm (the total thickness of the two layers of 122 and 120 corresponding to the optical thickness of ¼ wavelength) and the Al0.5Ga0.5As high refractive index layer 118 having the thickness of 50 nm (corresponding to the optical thickness of ¼ wavelength). Then, the structure of the whole multilayer film reflection mirror 114 is formed while including these layers.

In the third process, in the above described structure, there is calculated the reflection spectra at the time when the layers are formed up to the GaAs absorption layer 122, that is, the reflection spectra in the low reflection region.

FIG. 9 shows the calculation results.

Here, there is shown the change in the reflection spectra in the case where the layer thickness of Al0.9Ga0.1As low refractive index layer 120 is intentionally changed in a range from −10 nm to +10 nm at every 5 nm based on the target value of 42 nm that is the optical thickness of ¼ wavelength.

There is clearly observed the broad dip wavelength in the low reflection region, and there is also observed the state where when the thickness of the above described layer 120 is changed, the dip wavelength is changed according to the change in the thickness of the layer. When the measurement resolution of the dip wavelength is set in the range of several nm, the variation in the layer thickness is also suppressed within the range of +/−5 nm, so that a desired loss can be introduced.

In the fourth process, the reflection spectra of the manufactured wafer are measured. The dip wavelength obtained from the reflection spectra is compared with the calculation value in FIG. 9, an amount of shift from the desired dip wavelength, that is, from the desired loss is checked. When the dip wavelength is too short, the crystal growth is again performed, so as to add the GaAs absorption layer 122, while the dip wavelength is too long, the GaAs absorption layer 122 is etched, and the like. The layer thickness adjustment and the dip wavelength measurement are repeated until the desired dip wavelength is obtained.

In the fifth process, the remaining portions of the layer structure, that is, the upper layer from the low reflection region, here the p-type GaAs/Al0.5Ga0.5As layer (124) is formed by performing the crystal growing process again. In the sixth process, after the above described processes up to the fifth process are ended, the element formation process is performed as follows by using the wafer subjected to the layer thickness adjustment.

First, the relief structure is formed. As the mask pattern forming process for forming the relief structure, a dielectric layer is deposited, and SiO2 is patterned by using photo lithography and wet etching using buffered fluoric acid. Here, the convex relief of φ3.5 μm is formed.

First, the GaAs contact layer as the upper half of the layer 124 is removed by citric acid based etchant selectively with respect to the Al0.5Ga0.5As high refractive index layer as the lower half of the same layer 124. Then, the Al0.5Ga0.5As high refractive index layer is etched selectively with respect to the GaAs absorption layer 122 which exists under the high refractive index layer, so that the surface of the GaAs absorption layer 122 is exposed to form the low reflection region.

Next, a mesa having a diameter of 20 to 30 μm is formed. Similarly to the above, the dielectric layer is patterned again and etched by dry etching, and the like, until at least the side surface of the AlGaAs selective oxidation layer is exposed.

At this time, alignment is performed by taking care to make the center of the relief diameter match with the center of the mesa diameter. Alternatively, there may also be adopted a process which enables the self-alignment of the centers.

Then, the Al0.98Ga0.2As oxidization constriction layer 116 is oxidized from the periphery of the mesa as required under high temperature steam atmosphere.

Here, the oxidation time is adjusted so that there is formed an oxidation constriction region which allows current to flow in the central region of a diameter of 6 μm. Then, a necessary dielectric layer is deposited and patterned again, so as to expose a portion of the p-type GaAs contact layer, on which portion a ring shaped Ti/Au is vapor-deposited so as to be formed as the p side electrode.

Then, AuGe/Ni/Au is vapor-deposited on the rear surface of the n-type GaAs substrate, and annealed at about 400° C., so that the n-side electrode is formed.

Finally, a chip of a necessary size is cut from the wafer. The chip is die-bonded to a package and the p side electrode is wire bonded, so that an element is completed.

Further, when the mask for an array is suitably designed, it is possible to manufacture not only a single element but also an array in which a plurality of elements are two dimensionally arranged.

In this way, the advantage of the surface emitting laser is that an array structure can be obtained comparatively easily only by changing the mask.

According to the above described configuration of the present exemplary embodiment, the reproducibility of the amount of introduced loss is significantly improved by the reflection spectrum measurement, so that the reproducibility and uniformity between wafers can be significantly improved.

Exemplary Embodiment 2

As exemplary embodiment 2, there will be described a vertical cavity surface emitting laser similarly including a convex surface relief structure oscillating at 680 nm.

In the present exemplary embodiment, the element structure is the same as the structure of exemplary embodiment 1 shown in FIG. 1, but as a manufacturing method of the convex surface relief structure, a selective growth is used instead of etching.

Figure 10A:
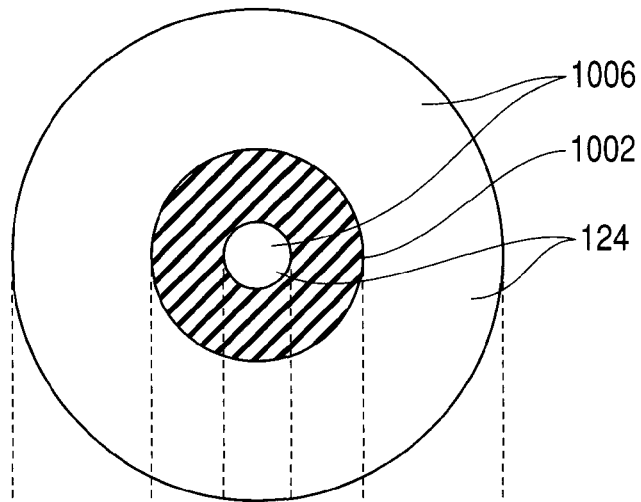
FIGS. 10A and 10B are schematic views for describing a configuration of a surface emitting laser including a convex surface relief structure in exemplary embodiment 2 according to the present invention, and a manufacturing method of the surface emitting laser.
Figure 10B:
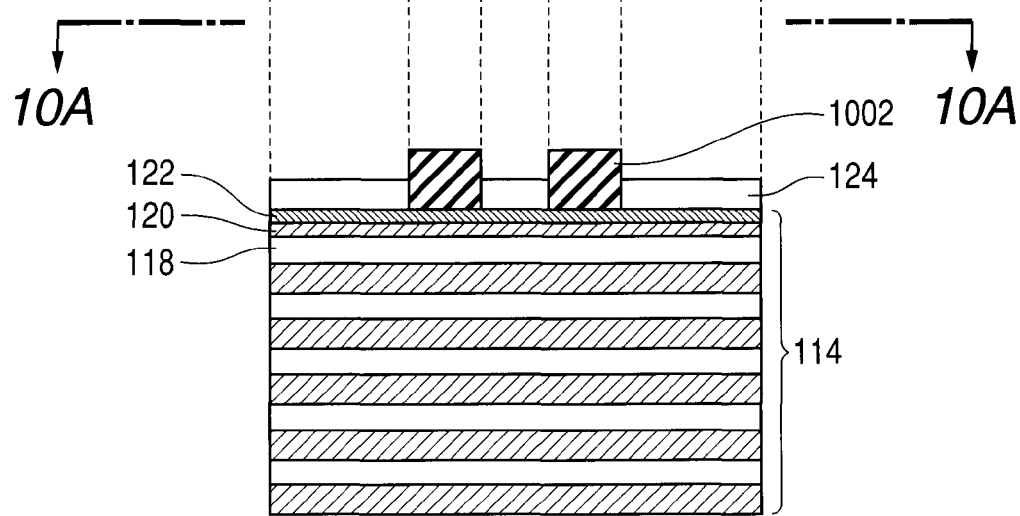

FIGS. 10A and 10B are cross-sectional schematic views for describing a configuration example of a vertical cavity surface emitting laser in the present exemplary embodiment.

In FIGS. 10A and 10B, the same portions as those shown in FIG. 1 are denoted by the same reference numerals, and the description of the duplicating portions is omitted.

In FIGS. 10A and 10B, reference numeral 1002 denotes a SiO2 film (low reflection region) which forms a dielectric film, and reference numeral 1006 denotes a high reflection region and the other region in which a contact with an electrode is formed.

In the present exemplary embodiment, the process is started from the state where the processes up to the fourth process in exemplary embodiment 1 are ended, that is, the stage in which the loss introduced into the low reflection region is determined after the layer thickness adjustment of the GaAs absorption layer 122 is ended. First, a mask for selective growth is formed by using the dielectric film. Specifically, the SiO2 film 1002 is deposited as the dielectric film.

Then, the SiO2 film 1002 is patterned by using photo lithography and wet etching. At this time, as shown in FIGS. 10A and 10B, the region in which the low reflection region is to be formed is covered by the SiO2 film 1002, and the other region 1006, which serves the high reflection region and in which a contact with an electrode is formed, is patterned so that GaAs absorption layer 122 is exposed for crystal growth.

Then, a convex relief structure is formed by forming by selectively growing the p-type GaAs/Al0.5Ga0.5As high refractive index layer 124 only in the region in which the GaAs absorption layer 122 is exposed.

Then, as described in exemplary embodiment 1, a mesa is formed, and the element forming process is further performed.

In this way, the present invention can be implemented not only by etching but also by selective growth, and hence the reproducibility of the amount of introduced loss by the reflection spectrum measurement can be significantly improved regardless of the forming method of the relief structure, so that the reproducibility and uniformity between wafers can be significantly improved.

Exemplary Embodiment 3

As exemplary embodiment 3, there is described a vertical cavity surface emitting laser similarly including a convex surface relief structure oscillating at 680 nm.

Figure 11:
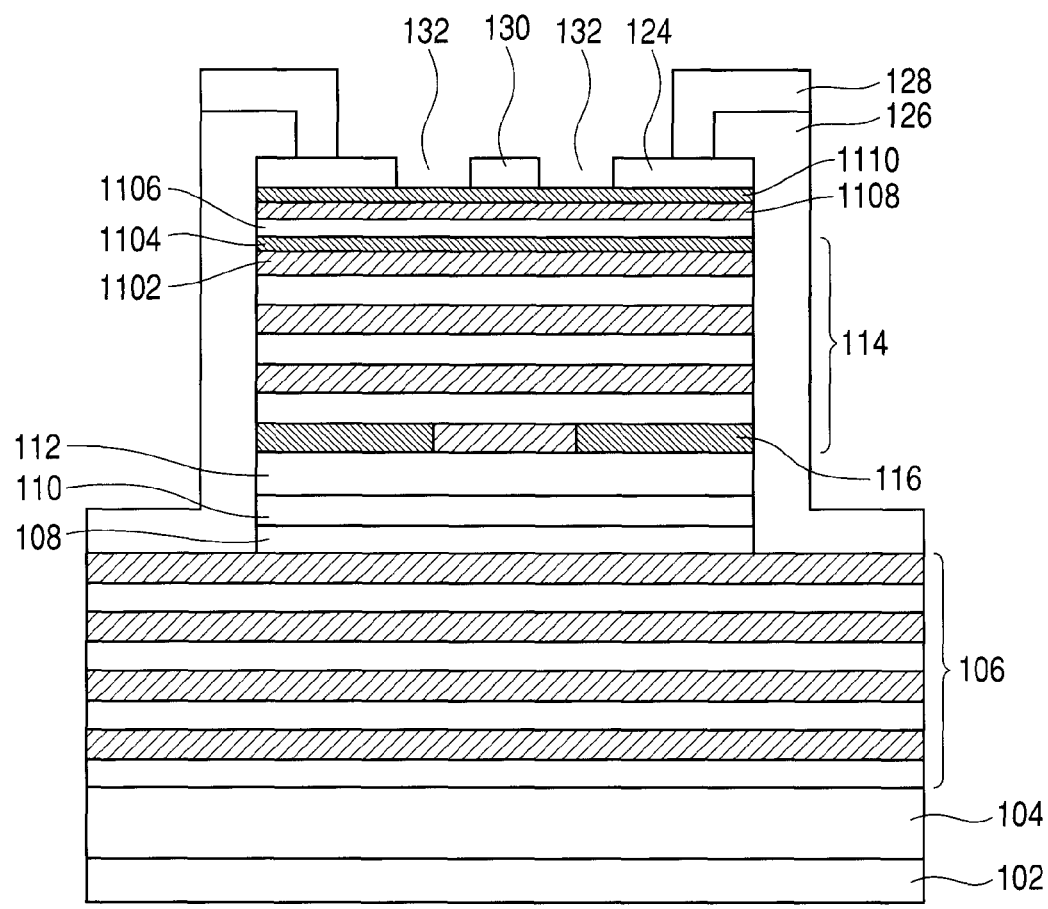
FIG. 11 is a cross-sectional schematic view for describing a configuration of a surface emitting laser including a convex surface relief structure in exemplary embodiment 3 according to the present invention, and a manufacturing method of the surface emitting laser.

FIG. 11 is a schematic view for describing a configuration example of a vertical cavity surface emitting laser in the present exemplary embodiment.

In FIG. 11, the same portions as those shown in FIG. 1 are denoted by the same reference numerals, and the description of the duplicating portions is omitted.

In FIG. 11, reference numeral 1102 denotes a p-type Al0.9Ga0.1As low refractive index layer, and reference numeral 1104 denotes a p-type GaAs absorption layer. Reference numeral 1106 denotes a p-type Al0.5Ga0.5As high refractive index layer, reference numeral 1108 denotes a p-type Al0.9Ga0.1As low refractive index layer, and reference numeral 1110 denotes a p-type GaInP etch stop layer.

In the present exemplary embodiment, the GaInP etch stop layer 1110 is used as an etch stop layer. The p-type GaAs absorption layer 1104 is used as an absorption layer similarly to exemplary embodiment 1, but the arrangement of the p-type GaAs absorption layer 1104 is different. In the specific configuration of the present exemplary embodiment, there are formed from the outermost surface a p-type GaAs contact layer having a thickness of 20 nm, and an Al0.5Ga0.5As high refractive index layer having a thickness of 27 nm (which corresponds to the layer 124 in FIG. 11 and to the optical thickness of ¼ wavelength).

Further, there are formed the p-type GaInP etch stop layer 1110 having a thickness of 10 nm, and the p-type Al0.9Ga0.1As low refractive index layer 1108 having a thickness of 43 nm (the total thickness of the two layers of 1110 and 1108 corresponding to the optical thickness of ¼ wavelength).

Further, there are formed the p-type Al0.5Ga0.5As high refractive index layer 1106 having a thickness of 44 nm, the p-type GaAs absorption layer 1104 having a thickness of 10 nm, and the p-type Al0.9Ga0.1As low refractive index layer 1102 having a thickness of 48 nm.

Further, the present exemplary embodiment includes a configuration in which the multilayer film reflection mirror 114 is formed while including these layers.

Here, the p-type GaAs absorption layer 1104 having the thickness of 10 nm is formed at the position of the node of the light standing wave intensity distribution at the time of operation of the surface emitting laser.

That is, the center of the absorption layer 1104 is arranged at the interface 610 from the high refractive index layer to the low refractive index layer as illustrated in FIG. 6.

Therefore, it is configured such that the total thickness of the Al0.5Ga0.5As high refractive index layer 1106 having the thickness of 44 nm and the half (5 nm) of the thickness of the GaAs absorption layer 1104 having the thickness of 10 nm corresponds to the optical thickness ¼ wavelength, and that the total thickness of the remaining half (5 nm) of the thickness of the GaAs absorption layer 1104 and the thickness of the Al0.9Ga0.1As low refractive index layer 1102 having the thickness of 48 nm corresponds to the optical thickness ¼ wavelength.

The position of the node at which the GaAs absorption layer 1104 is provided becomes, as shown in FIG. 6, an antinode in the light intensity distribution in the reflection spectrum measurement in the low reflection region, and thereby a sufficient absorption is caused so that the measurement of the dip wavelength can be performed.

Here, it may also be devised such that a hetero barrier is reduced by inserting a graded layer in each of the interfaces, so as to suppress the unnecessary increase of electric resistance. According to the present exemplary embodiment, it is possible to estimate the amount of the introduced loss by the method as described in exemplary embodiment 1, so that an element having excellent uniformity and reproducibility can be formed.

Exemplary Embodiment 4

As exemplary embodiment 4, there will be described a configuration example of an optical apparatus configured by applying the vertical cavity surface emitting laser according to the present invention.

Figure 12A:
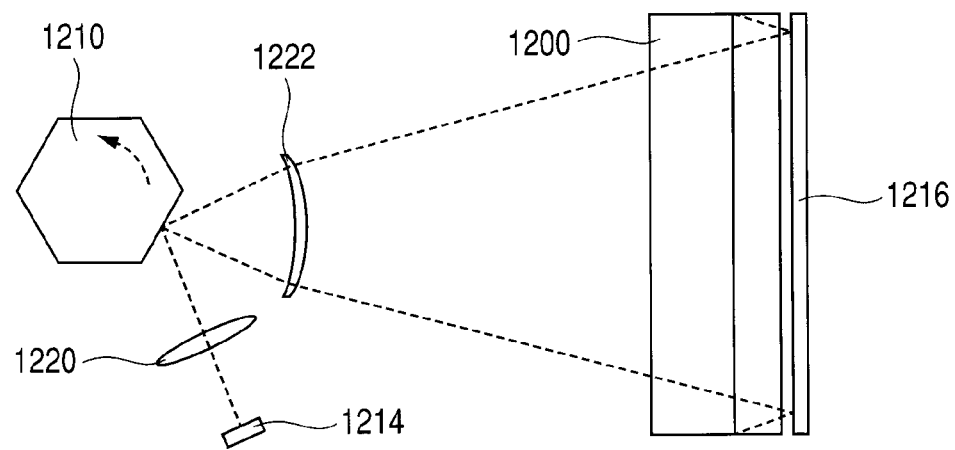
FIGS. 12A and 12B are schematic views for describing an image forming apparatus in exemplary embodiment 4 according to the present invention.
Figure 12B:
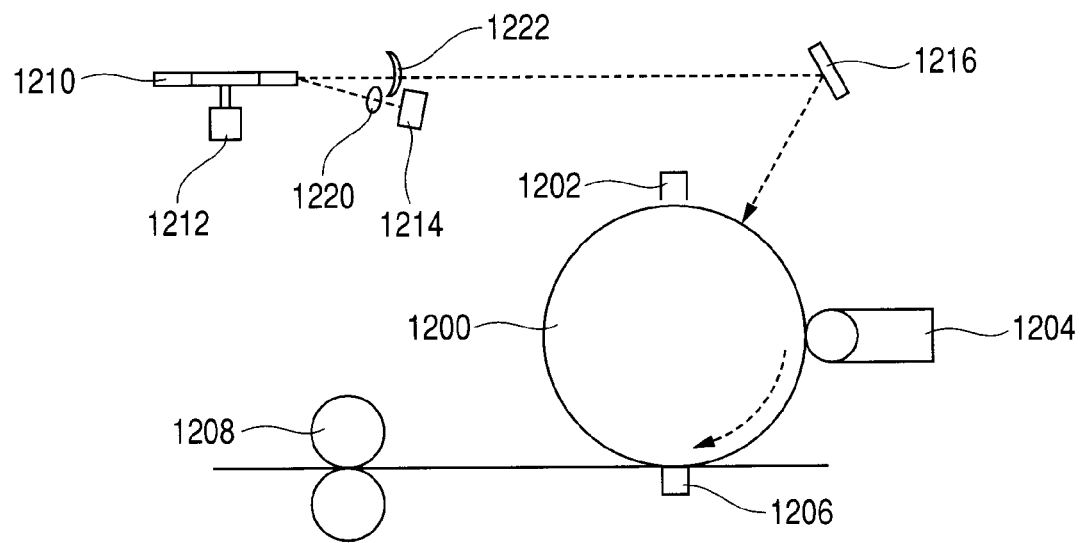

Here, there is described a configuration example of an image forming apparatus configured by using as an optical apparatus the red surface emitting laser array using the vertical cavity surface emitting lasers according to the present invention. FIGS. 12A and 12B are figures illustrating a configuration of an electrophotographic recording type image forming apparatus in which a laser array using the red surface emitting lasers according to the present exemplary embodiment is mounted.

FIG. 12A is a top view of the image forming apparatus, and FIG. 12B is a side view of the image forming apparatus. In FIGS. 12A and 12B, reference numeral 1200 denotes a photoreceptor, reference numeral 1202 denotes a charger, reference numeral 1204 denotes a developing device, reference numeral 1206 denotes a transfer charger, reference numeral 1208 denotes a fixing device, reference numeral 1210 denotes a rotary polygon mirror, and reference numeral 1212 denotes a motor. Further, reference numeral 1214 denotes a red surface emitting laser array, reference numeral 1216 denotes a reflection mirror, reference numeral 1220 denotes a collimator lens, and reference numeral 1222 denotes an f-θ lens.

The image forming apparatus according to the present exemplary embodiment is configured such that light beams from the light source configured by applying the vertical cavity surface emitting lasers according to the present invention are made incident on the photoreceptor so as to form an image.

Specifically, the motor 1212 illustrated in FIGS. 12A and 12B is configured so as to rotationally drive the rotary polygon mirror 1210.

Further, the rotary polygon mirror 1210 in the present exemplary embodiment includes six reflection surfaces. Reference numeral 1214 denotes the red surface emitting laser array serving as a light source for recording.

The red surface emitting laser array 1214 is turned on and off by a laser driver (not illustrated) according to an image signal. The laser light beam modulated in this way is irradiated from the red surface emitting laser array 1214 toward the rotary polygon mirror 1210 via the collimator lens 1220.

The rotary polygon mirror 1210 is rotated in the arrow direction. The laser light beams output from the red surface emitting laser array 1214 are reflected to be deflected beams whose emission angle is continuously changed by the reflection surface of the rotary polygon mirror 1210 according to the rotation of the rotary polygon mirror 1210.

The reflected light beams are subjected to distortion aberration correction, and the like, by the f-θ lens 1222, and are then irradiated onto the photoreceptor 1200 through the reflection mirror 1216, so as to be scanned in the main scanning direction on the photoreceptor 1200.

At this time, images of a plurality of lines corresponding to the red surface emitting laser array 1214 are formed in the main scanning direction of the photoreceptor 1200 by the light beams reflected by one reflection surface of the rotary polygon mirror 1210.

In the present exemplary embodiment, a 4×8 red surface emitting laser array 1214 is used, and hence images of 32 lines are simultaneously formed.

The photoreceptor 1200 is charged beforehand by the charger 1202, and is successively exposed by the scanning of the laser light beam, so that an electrostatic latent image is formed.

Further, the photoreceptor 1200 is rotated in the arrow direction, and the formed electrostatic latent image is developed by the developing device 1204. The developed visible image is transferred onto a transfer paper (not shown) by the transfer charger 1206.

The transfer paper with the visible image transferred thereon is conveyed to the fixing device 1208, so as to be fixed, and is then discharged outside the image forming apparatus.

Further, in the present example, the 4×8 red surface emitting laser array is used, but the red surface emitting laser array is not limited to this. An m×n red surface emitting laser array (where m and n are natural numbers) may be used.

As described above, when the red surface emitting laser array according to the present exemplary embodiment is used in an electrophotographic recording type image forming apparatus, it is possible to obtain an image forming apparatus which enables high speed and highly precise printing.

Note that in the above description, there is described an example in which an image forming apparatus is configured as an optical apparatus, but the present invention is not limited to such configuration.

For example, an optical apparatus, such as a projection display, may also be configured such that a light source configured by applying the vertical cavity surface emitting laser according to the present invention is used, and that the light beam from the light source is made incident on an image display body so as to display an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-198984, filed Jul. 31, 2008, which is hereby incorporated by reference herein in its entirety.

What is claimed is:

1. A manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in a central portion of the low reflectance region, and which oscillates at a wavelength of $\lambda$, the manufacturing method comprising:

forming, when a multilayer film reflection mirror based on a laminated structure formed by laminating a plurality of layers is formed as the upper reflection mirror, an absorption layer causing band-to-band absorption in the laminated structure;

measuring reflection spectra by irradiating light to the laminated structure after forming the absorption layer and before ending formation of the multilayer film reflection mirror;

measuring a broad dip wavelength obtained by the measuring of the reflection spectra; and adjusting a thickness of a surface layer of the laminated structure based on the dip wavelength.

2. The manufacturing method of the surface emitting laser according to claim 1, further comprising forming, during the forming of the absorption layer, an absorption layer on a surface side from a layer laminated at a middle point in thickness of the laminated structure, and in a layer other than an outermost surface layer.

3. The manufacturing method of the surface emitting laser according to claim 1, further comprising forming, during the forming of the absorption layer, an absorption layer within five pairs of layers from a surface side of the laminated structure.

4. The manufacturing method of the surface emitting laser according to claim 1, wherein the absorption layer is formed so that, when seen from a surface side of the multilayer film reflection mirror, a part of the absorption layer is included in an interface from a high refractive index layer to a low refractive index layer in the multilayer film reflection mirror.

5. A manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a convex high reflectance region formed in a central portion of the low reflectance region, and which oscillates at a wavelength of $\lambda$, the manufacturing method comprising:

forming, when a multilayer film reflection mirror based on a laminated structure formed by laminating a plurality of layers is formed as the upper reflection mirror, an absorption layer causing band-to-band absorption in the laminated structure;

forming a semiconductor layer on a surface of the laminated structure after forming the absorption layer and before ending formation of the multilayer film reflection mirror;

measuring reflection spectra by irradiating light to the semiconductor layer formed on the surface of the laminated structure;

measuring a broad dip wavelength obtained by the measuring of the reflection spectra; and adjusting a thickness of the semiconductor layer based on the dip wavelength.

6. The manufacturing method of the surface emitting laser according to claim 5, wherein the absorption layer is made of a material having an absorption coefficient of 5000 $cm^{-1}$ or more for the wavelength $\lambda$.

7. The manufacturing method of the surface emitting laser according to claim 5, further comprising forming, during the forming of the absorption layer, an absorption layer on a surface side from a layer laminated at a middle point in thickness of the laminated structure, and in a layer other than an outermost surface layer.

8. The manufacturing method of the surface emitting laser according to claim 5, further comprising forming, during the forming of the absorption layer, an absorption layer within five pairs of layers from a surface side of the laminated structure.

9. The manufacturing method of the surface emitting laser according to claim 5, wherein the absorption layer is formed so that, when seen from a surface side of the multilayer film reflection minor, a part of the absorption layer is included in an interface from a high refractive index layer to a low refractive index layer in the multilayer film reflection mirror.

10. A manufacturing method of a surface emitting laser in which a lower reflection minor, an active layer, and an upper reflection minor are successively laminated on a substrate, in which there is formed, in a light emitting section of the upper reflection minor, a structure for controlling reflectance that is configured by a low reflectance region and a convex high reflectance region formed in a central portion of the low reflectance region, and which oscillates at a wavelength of $\lambda$, the manufacturing method comprising:
  forming, when a multilayer film reflection mirror based on a laminated structure formed by laminating a plurality of layers is formed as the upper reflection minor, an absorption layer having an absorption coefficient of 5000 cm$^{-1}$ or more for the wavelength of $\lambda$ in the laminated structure;
  measuring reflection spectra by irradiating light to the laminated structure after forming the absorption layer and before ending formation of the multilayer film reflection minor;
  measuring a broad dip wavelength obtained by the measuring of the reflection spectra; and
  adjusting a thickness of a surface layer of the laminated structure based on the dip wavelength.

11. A manufacturing method of a surface emitting laser in which a lower reflection minor, an active layer, and an upper reflection minor are successively laminated on a substrate, in which there is formed, in a light emitting section of the upper reflection minor, a structure for controlling reflectance that is configured by a low reflectance region and a convex high reflectance region formed in a central portion of the low reflectance region, and which oscillates at a wavelength of $\lambda$, the manufacturing method comprising:
  forming, when a multilayer film reflection mirror based on a laminated structure formed by laminating a plurality of layers is formed as the upper reflection minor, an absorption layer having an absorption coefficient of 5000 cm$^{-1}$ or more for the wavelength of $\lambda$ in the laminated structure;
  forming a semiconductor layer on a surface of the laminated structure after forming the absorption layer and before ending formation of the multilayer film reflection minor;
  measuring reflection spectra by irradiating light to the semiconductor layer formed on the surface of the laminated structure;
  measuring a broad dip wavelength obtained by the measuring of the reflection spectra; and
  adjusting a thickness of the semiconductor layer based on the dip wavelength.

* * * * *